United States Patent
Hua et al.

(10) Patent No.: US 12,520,533 B2
(45) Date of Patent: Jan. 6, 2026

(54) TRANSISTOR DEVICE AND GATE STRUCTURE

(71) Applicant: WIN SEMICONDUCTORS CORP., Taoyuan (TW)

(72) Inventors: Chang-Hwang Hua, Taoyuan (TW); Shu-Hsiao Tsai, Taoyuan (TW); Rong-Hao Syu, Taoyuan (TW); Chun-Han Song, Taoyuan (TW); Pei-Ying Wu, Taoyuan (TW); Zong-Zheng Yan, Taoyuan (TW)

(73) Assignee: WIN SEMICONDUCTORS CORP., Taoyuan (TW)

( * ) Notice: Subject to any disclaimer, the term of this patent is extended or adjusted under 35 U.S.C. 154(b) by 532 days.

(21) Appl. No.: 18/046,974

(22) Filed: Oct. 17, 2022

(65) Prior Publication Data

US 2023/0126870 A1    Apr. 27, 2023

Related U.S. Application Data

(60) Provisional application No. 63/272,343, filed on Oct. 27, 2021.

(51) Int. Cl.
| | |
|---|---|
| *H10D 30/67* | (2025.01) |
| *H01L 23/31* | (2006.01) |
| *H10D 30/47* | (2025.01) |
| *H10D 62/85* | (2025.01) |
| *H10D 64/01* | (2025.01) |
| *H10D 64/64* | (2025.01) |

(52) U.S. Cl.
CPC ....... *H10D 30/675* (2025.01); *H01L 23/3171* (2013.01); *H10D 30/475* (2025.01); *H10D 30/6738* (2025.01); *H10D 62/85* (2025.01); *H10D 64/01* (2025.01); *H10D 64/64* (2025.01)

(58) Field of Classification Search
None
See application file for complete search history.

(56) References Cited

U.S. PATENT DOCUMENTS

| | | | |
|---|---|---|---|
| 5,358,885 A | 10/1994 | Oku et al. | |
| 5,496,748 A | 3/1996 | Hattori et al. | |
| 6,294,480 B1 * | 9/2001 | Pradeep | ............ H01L 21/31144 257/E21.252 |
| 6,380,008 B2 * | 4/2002 | Kwok | ................... H10D 64/518 257/E21.198 |
| 7,019,336 B2 | 3/2006 | Yamashita et al. | |
| 7,897,446 B2 | 3/2011 | Smorchkova et al. | |
| 8,912,084 B2 | 12/2014 | Sasaki et al. | |
| 9,240,473 B2 | 1/2016 | Heikman et al. | |
| 9,412,829 B2 | 8/2016 | Nishizawa | |

(Continued)

OTHER PUBLICATIONS

Chinese langauge office acton dated Aug. 9, 2023, issued in application No. TW 111140203.

*Primary Examiner* — Yara B Green
*Assistant Examiner* — Fakeha Sehar
(74) *Attorney, Agent, or Firm* — McClure, Qualey & Rodack, LLP

(57) ABSTRACT

A transistor device includes a substrate and a gate structure. The gate structure is disposed on the substrate. The gate structure includes a first metal layer and a refractory metal layer disposed on the first metal layer, wherein the first metal layer is disconnected and the refractory metal layer is disconnected.

19 Claims, 14 Drawing Sheets

(56) References Cited

U.S. PATENT DOCUMENTS

| | | |
|---|---|---|
| 9,455,327 B2 | 9/2016 | Ritenour |
| 10,043,664 B2 | 8/2018 | Oda et al. |
| 10,439,028 B2 | 10/2019 | Hitora et al. |
| 2008/0230786 A1* | 9/2008 | Heikman ............. H10D 64/111 257/E29.253 |
| 2011/0092057 A1* | 4/2011 | Suvorov ............. H01L 21/0465 257/E21.333 |
| 2011/0180850 A1 | 7/2011 | Shih et al. |
| 2013/0334647 A1* | 12/2013 | Sasaki ................ H10D 30/4755 257/471 |

* cited by examiner

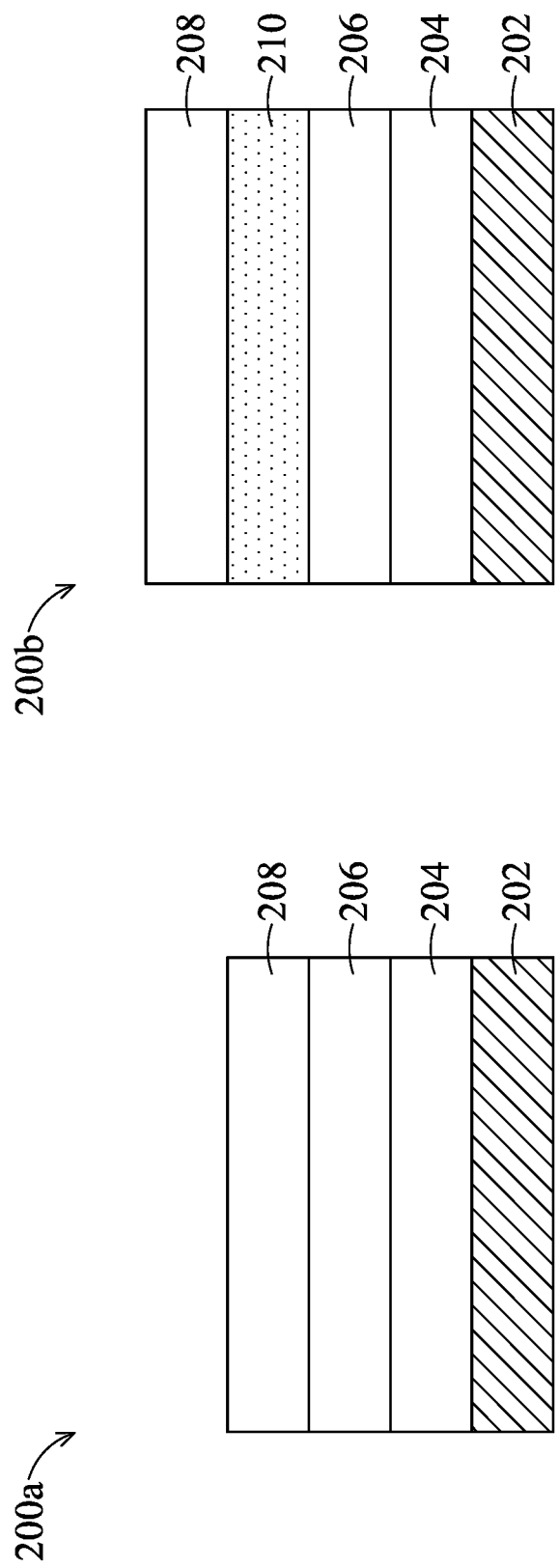

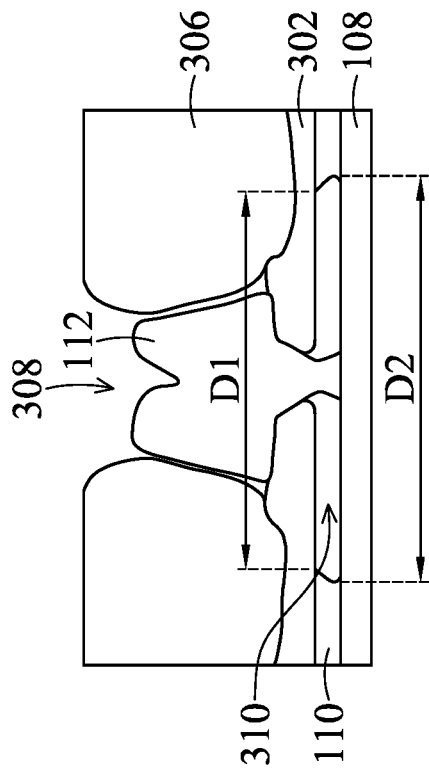
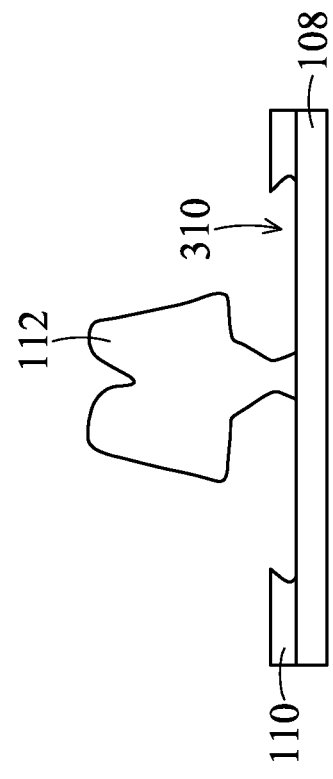
FIG. 3A
FIG. 3C
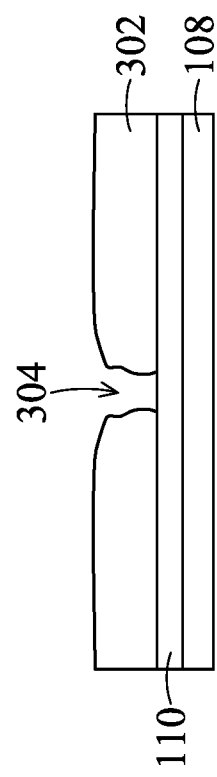
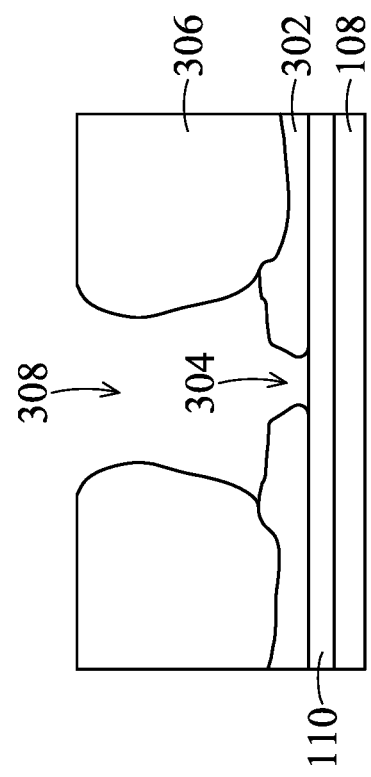
FIG. 3B
FIG. 3D

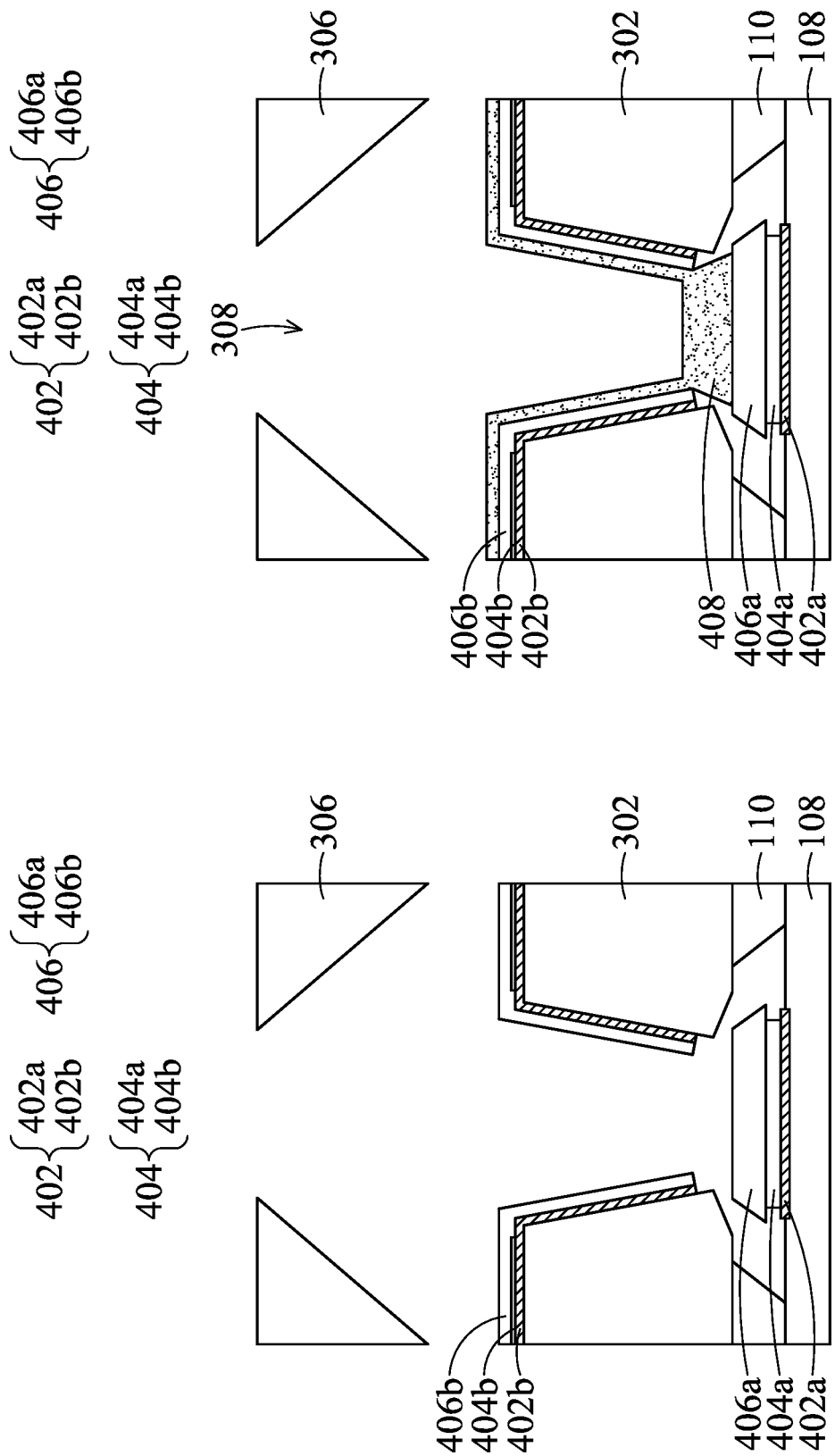

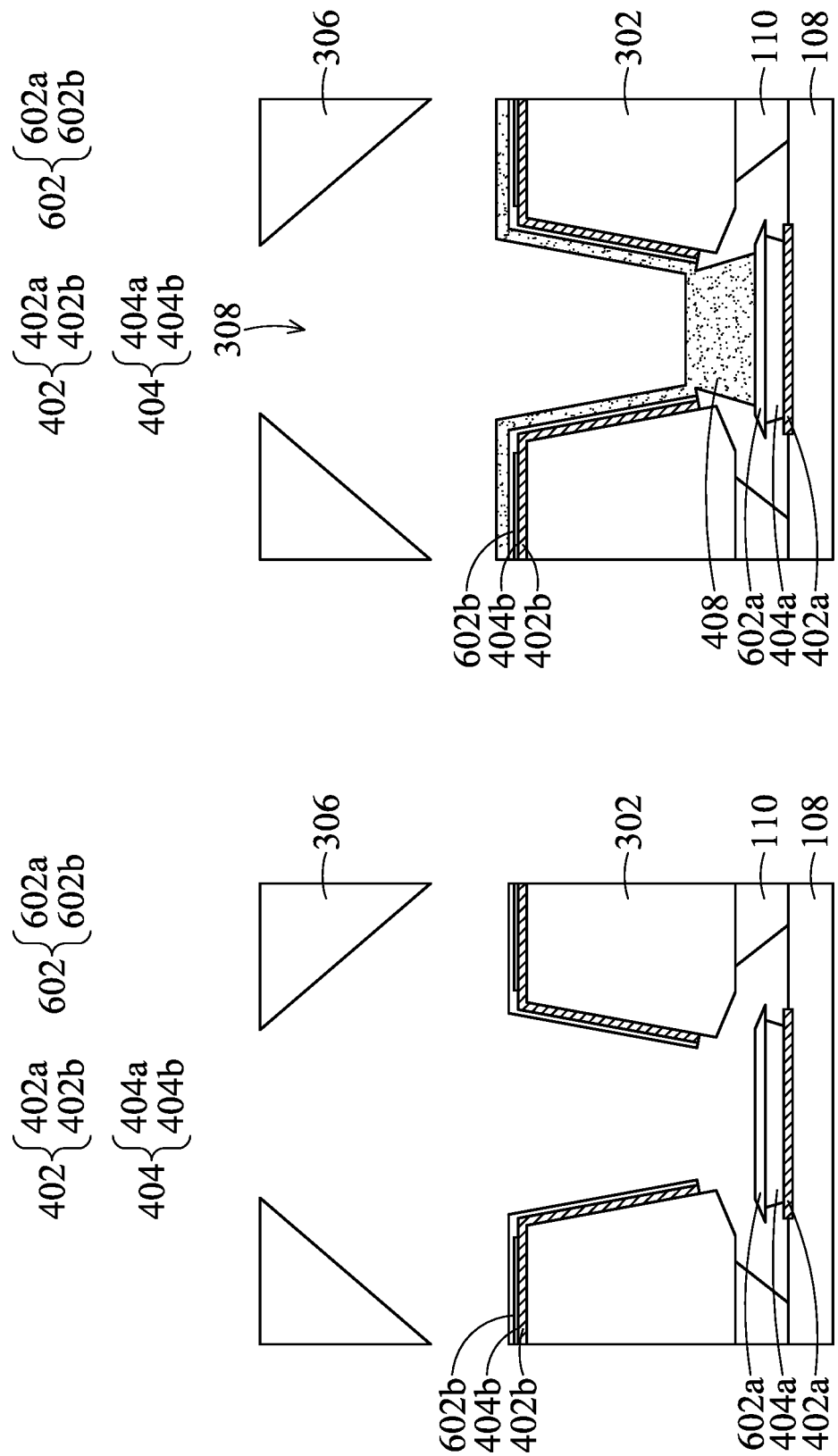

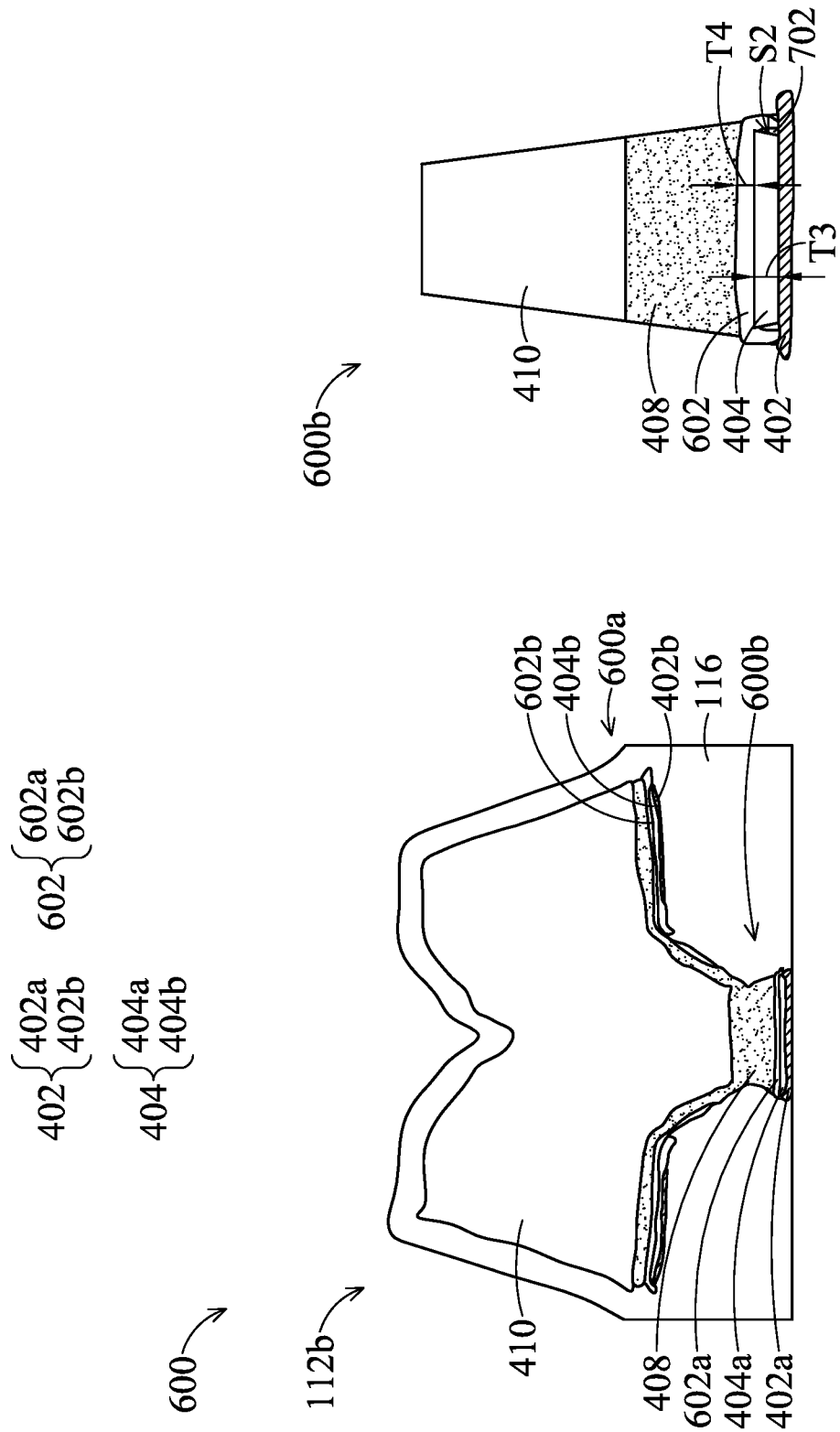

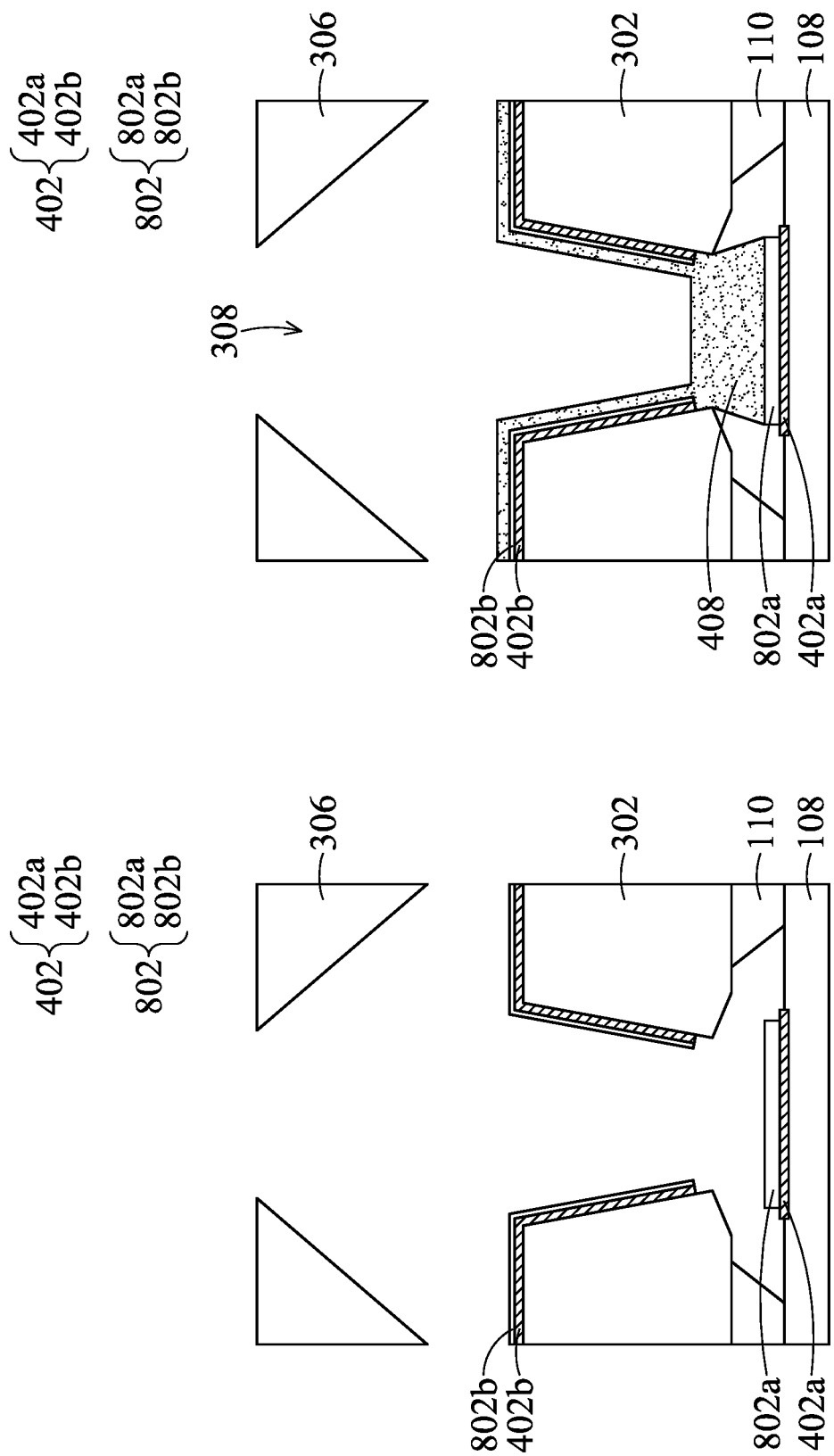

TRANSISTOR DEVICE AND GATE STRUCTURE

CROSS REFERENCE TO RELATED APPLICATIONS

This application claims the benefit of U.S. Provisional Application No. 63/272,343 filed on Oct. 27, 2021, the entirety of which is incorporated by reference herein.

BACKGROUND

Technical Field

Embodiments of the present disclosure relates to semiconductor technology, and in particular to a gate structure for a transistor device.

Description of the Related Art

The semiconductor industry has experienced exponential growth. Technological advances in semiconductor design have produced generations of semiconductor devices (e.g., transistors) where each generation can work more efficiently than the previous generation. The progress generally provides benefits by increasing production efficiency and lowering associated costs. For these advances to be realized, developments in semiconductor design and manufacturing are needed.

However, although existing semiconductor devices generally meet requirements, they have not been satisfactory in every respect. For example, the gate structure of the semiconductor device may be optimized. Therefore, further improvements to the semiconductor devices are required.

BRIEF SUMMARY

Transistor devices and gate structures are provided. An exemplary embodiment of a transistor device includes a substrate and a gate structure. The gate structure is disposed on the substrate and includes a first metal layer and a refractory metal layer disposed on the first metal layer, wherein the first metal layer is disconnected and the refractory metal layer is disconnected.

Another exemplary embodiment of a transistor device includes a plurality of semiconductor layers, a gate structure, and a passivation layer. The gate structure is disposed on the plurality of semiconductor layers and includes a first metal layer, at least one refractory metal layer, and a second metal layer. The at least one refractory metal layer is disposed on the first metal layer. The second metal layer is disposed on the refractory metal layer. The passivation layer surrounds the gate structure and is in contact with the first metal layer and the refractory metal layer at a bottom portion of the gate structure.

Yet another exemplary embodiment of a gate structure includes a sinking layer, a refractory metal layer, and a contact layer. The sinking layer includes a first lower portion and a first upper portion which are separate. The refractory metal layer includes a second lower portion and a second upper portion which are separate, wherein the second lower portion is disposed on the first lower portion and the second upper portion is disposed on the first upper portion. The contact layer is disposed on the refractory metal layer.

BRIEF DESCRIPTION OF THE DRAWINGS

The present disclosure can be more fully understood by reading the subsequent detailed description and examples with references made to the accompanying drawings, wherein:

FIG. 2A is a cross-sectional view of an exemplary gate structure for a transistor device in accordance with some embodiments.

FIG. 2B is a cross-sectional view of an exemplary gate structure for a transistor device in accordance with some embodiments.

FIGS. 3A-3D are cross-sectional views of an exemplary transistor device at various stages of manufacture in accordance with some embodiments.

FIGS. 4A-4F are cross-sectional views of an exemplary transistor device at various stages of manufacture in accordance with some embodiments.

FIG. 5 is a cross-sectional view of a portion of the exemplary transistor device of FIG. 4F in accordance with some embodiments.

FIGS. 6A-6D are cross-sectional views of an exemplary transistor device at various stages of manufacture in accordance with some embodiments.

FIG. 7 is a cross-sectional view of a portion of the exemplary transistor device of FIG. 6D in accordance with some embodiments.

FIGS. 8A-8D are cross-sectional views of an exemplary transistor device at various stages of manufacture in accordance with some embodiments.

DETAILED DESCRIPTION

Figure 1:
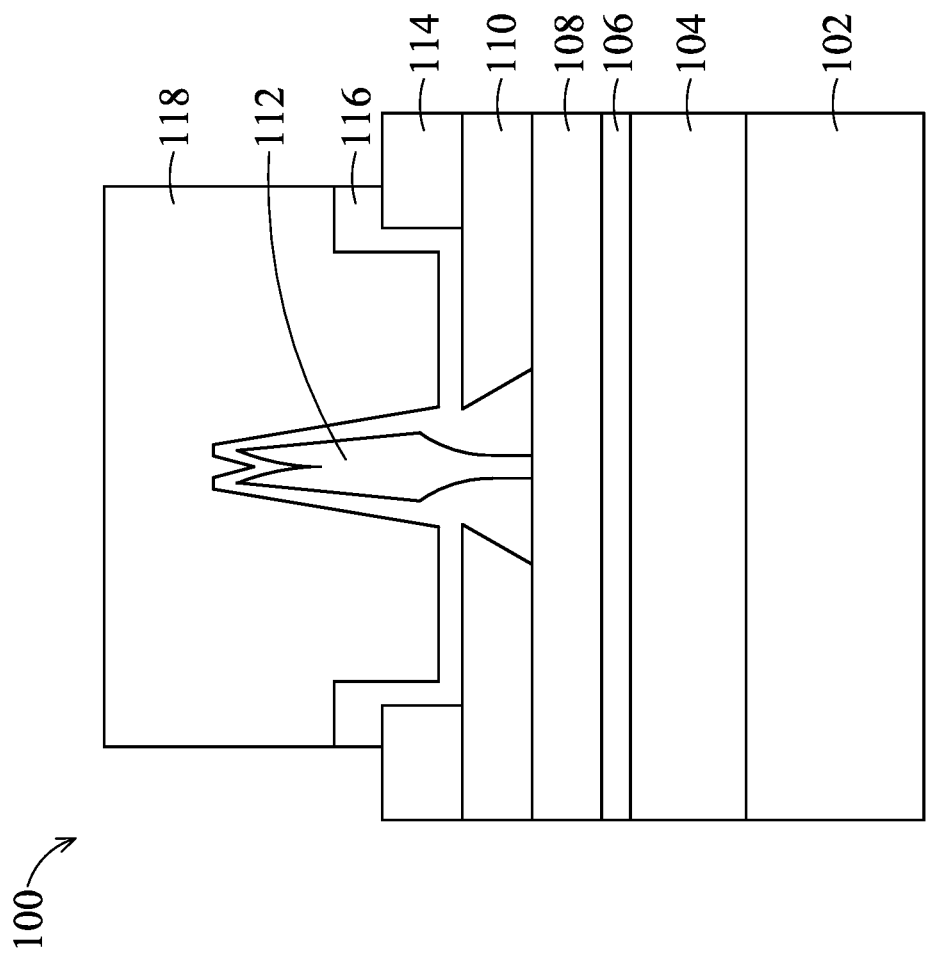
FIG. 1 is a cross-sectional view of an exemplary transistor device in accordance with some embodiments.

The following description is made for the purpose of illustrating the general principles of the present disclosure and should not be taken in a limiting sense. The scope of the present disclosure is best determined by reference to the appended claims.

The present disclosure will be described with respect to particular embodiments and with reference to certain drawings, but the disclosure is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the disclosure.

It should be understood that when an element, such as a layer, region or substrate, is referred to as being "on" or extending "onto" another element, the element can be directly on or extend directly onto the other element or intervening elements may also be present. It should also be understood that when an element is referred to as being "connected" or "coupled" to another element, it can be directly connected or coupled to the other element or intervening elements may be present.

It should be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Unless otherwise defined, all terms (including technical and scientific terms) used herein have the same meaning as commonly understood by one of ordinary skill in the art to which the present disclosure belongs. It should be further understood that terms, such as those defined in commonly used dictionaries, should be interpreted as having a meaning that is consistent with their meaning in the context of the relevant art and will not be interpreted in an idealized or overly formal sense unless expressly so defined herein.

The term "cover" may be defined as at least partially overlap when viewing from above. The term "disconnected" may refer to a layer or a component having at least two portions (e.g., 3, 4, or 5 portions) which are not connected to each other, while the at least two portions of the layer may be formed at the same process. For example, there may be space(s) separating these portions, but not limited thereto. The length may refer to the minimum length, but not limited thereto. For example, the length may be the minimum length of the top surface, but not limited thereto. For another example, the length may refer to the length of the orthogonal projection on a surface parallel to the surface of the substrate, but not limited thereto. The features of the embodiments may be modified or reorganized to form a new combination as a new embodiment.

The spatially relative descriptors of one element and another element may change as the structure is operated or used in different orientations. In addition, the present disclosure may repeat reference numerals and/or letters in the various embodiments. This repetition is for simplicity and clarity and does not in itself dictate a relationship between the various embodiments discussed.

A gate structure for a semiconductor device (e.g., a transistor device) is described in accordance with some embodiments of the present disclosure, and may be particularly applicable to a transistor device, such as a high electron mobility transistor (HEMT) or a p-HEMT device, but not limited thereto. The gate structure may include a multi-layer structure.

FIG. 1 is a cross-sectional view of a transistor device 100 in accordance with some embodiments. Additional features can be added to the transistor device 100. Some of the features described below can be replaced or eliminated for different embodiments. To simplify the diagram, only a portion of the transistor device 100 is illustrated. The transistor device 100 may be a HEMT, a pseudomorphic HEMT (pHEMT), or any suitable transistor, but not limited thereto.

As shown in FIG. 1, the transistor device 100 may include a substrate 102, in accordance with some embodiments. The material of the substrate 102 may include element or compound, such as sapphire, aluminum nitride, aluminum gallium nitride, gallium nitride, silicon, germanium, silicon carbide, GaAs, ZnO, InP, the like, or a combination thereof, but not limited thereto. The substrate 102 may be a bulk substrate or a composite substrate formed of different materials. The substrate 102 may include a semiconductor-on-insulator (SOI) substrate formed by disposing a semiconductor material on an insulating layer. The substrate 102 may be doped (such as using one or more p-type or n-type dopants) or undoped. Any desired semiconductor elements (including active elements and/or passive elements) may be formed in and on the substrate 102. However, in order to simplify the figures, only the flat substrate 102 is illustrated.

As shown in FIG. 1, the transistor device 100 may include a plurality of semiconductor layers disposed on the substrate 102, in accordance with some embodiments. The semiconductor layers may include a buffer layer 104, a channel layer 106, a barrier layer 108 (e.g., a Schottky barrier layer), a cap layer 110, any suitable layer, or a combination thereof, but not limited thereto. A two-dimensional electron gas (2DEG) may substantially exist at the interface between the channel layer 106 and the barrier layer 108.

The material of the semiconductor layers may include one or more III-V group semiconductor, but not limited thereto. The material of the semiconductor layers may include compound semiconductor, such as silicon carbide. As used herein, the term "III-V group semiconductor" may refer to those semiconducting compounds formed between the elements in group III and the elements in group V of the periodic table, including aluminum (Al), gallium (Ga), indium (In), nitrogen (N), phosphorus (P), arsenic (As), the like, or a combination thereof. The term may also refer to ternary and quaternary compounds, including AlGaN, AlInGaN, the like, or a combination thereof. The semiconductor layers may be formed by a deposition process, including molecular beam epitaxy (MBE), liquid phase epitaxy (LPE), metal organic chemical vapor deposition (MOCVD), metal organic vapor phase epitaxy (MOVPE), the like, or a combination thereof.

Figure 2C:
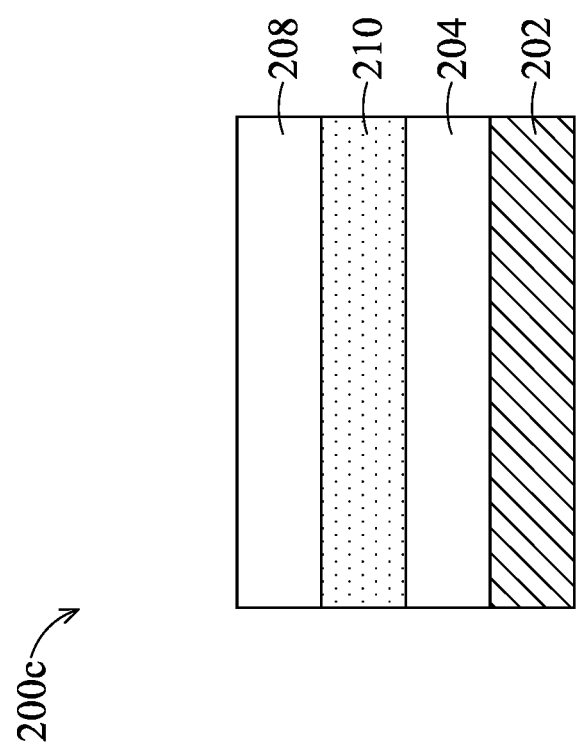
FIG. 2C is a cross-sectional view of an exemplary gate structure for a transistor device in accordance with some embodiments.

As shown in FIG. 1, the transistor device 100 may include a gate structure 112 disposed on the semiconductor layers. The gate structure 112 may include a stack of metal layers. Further details regarding the materials of the gate structure 112 are discussed with reference to FIGS. 2A, 2B and 2C. FIGS. 2A, 2B and 2C are cross-sectional views of gate structures 200a, 200b, 200c, respectively, for a transistor device in accordance with some embodiments.

As shown in FIG. 2A, the stack of the gate structure 200a may include a first metal layer 202, a refractory metal layer 204 disposed on the first metal layer 202, a protection layer 206 disposed on the refractory metal layer 204, and a second metal layer 208 disposed on the protection layer 206, in accordance with some embodiments. One or more of the abovementioned layers may be omitted. For example, the protection layer 206 may be omitted.

In some embodiments, the first metal layer 202 may be a sinking layer, but not limited thereto. The material of the first metal layer 202 may include platinum (Pt) or any other suitable materials, but not limited thereto. The material of the first metal layer 202 including platinum (Pt) can form an enhancement mode (E-mode) HEMT device or a depletion mode (D-mode) HEMT device, but not limited thereto.

The refractory metal layer 204 may have a melting temperature greater than 2200° C., but not limited thereto. The material of the refractory metal layer 204 may include molybdenum (Mo), tantalum (Ta), tungsten (W), niobium (Nb), rhenium (Re), the like, an alloy thereof (e.g., tungsten-titanium (TiW)), or a combination thereof. The material of the refractory metal layer 204 may resist high temperature, resist electron migration, resist metal diffusion, or keep stable activity, but not limited thereto.

The material of the protection layer 206 may include nickel (Ni), titanium (Ti), aluminum (Al), tantalum (Ta), chromium (Cr), zirconium (Zr), yttrium (Y), niobium (Nb), lanthanum (La), hafnium (Hf), tungsten (W), the like, an alloy thereof (e.g., tungsten-titanium (TiW)), or a combination thereof. In other embodiments, the protection layer 206 may include one or more diffusion barrier layer, but not limited thereto.

In some embodiments, the second metal layer 208 may be a contact layer, but not limited thereto. The material of the second metal layer 208 may include gold (Au) or any other suitable materials, but not limited thereto.

For example, the gate structure 200a may include the stack arrangement such as Pt/Mo/Ni/Au, Pt/Mo/Ti/Au, Pt/Ta/Ni/Au, Pt/W/Ni/Au Pt/TiW/Ni/Au, Pt/Mo/TiW/Au, Pt/Mo/Ta/Au, Pt/Mo/Ta/Ni/Au, or any suitable stack of metal layers, but not limited thereto. These stack arrangements are listed for illustrative purposes only. One or more metal layers may be inserted into the stack arrangement, but not limited thereto. To be specific, the stack arrangement A/B/C may mean that the layer of B is disposed on the layer of A, and the layer of C is disposed on the layer of B.

Referring now to FIG. 2B. It should be noted that the stack of the gate structure 200b may include the same or similar components as that of the gate structure 200a, which is illustrated in FIG. 2A, and for the sake of simplicity, those components will not be discussed in detail again. In comparison with the embodiment of FIG. 2A where the second metal layer 208 is disposed on the protection layer 206, in the following embodiments, a third metal layer 210 is disposed therebetween.

As shown in FIG. 2B, the stack of the gate structure 200b may include a first metal layer 202, a refractory metal layer 204 disposed on the first metal layer 202, a protection layer 206 disposed on the refractory metal layer 204, a third metal layer 210 disposed on the protection layer 206, and a second metal layer 208 disposed on the third metal layer 210, in accordance with some embodiments. One or more of the abovementioned layers of the stack may be omitted. For example, the protection layer 206 may be omitted.

In some embodiments, the third metal layer 210 may be a diffusion barrier layer. The material of the third metal layer 210 may include platinum (Pt) or any other suitable materials, but not limited thereto.

For example, the gate structure 200b may include the stack arrangement such as Pt/Mo/Pt/Au, Pt/Ta/Pt/Au, Pt/Mo/Ti/Pt/Au, Pt/Mo/Ni/Pt/Au, Pt/Ta/Ti/Pt/Au, Pt/Ta/Ni/Pt/Au, Pt/W/Ti/Pt/Au, Pt/W/Ni/Pt/Au, Pt/TiW/Ti/Pt/Au, Pt/TiW/Ni/Pt/Au, Pt/Mo/TiW/Pt/Au, Pt/Mo/Ta/Pt/Au, Pt/Mo/Ta/Ti/Pt/Au, Pt/Mo/Ta/Ni/Pt/Au, or any suitable stack of metal layers, but not limited thereto. These stack arrangements are listed for illustrative purposes only. One or more metal layers may be inserted into the stack arrangement, but not limited thereto. To be specific, the stack arrangement A/B/C may mean that the layer of B is disposed on the layer of A, and the layer of C is disposed on the layer of B.

Referring now to FIG. 2C. It should be noted that the stack of the gate structure 200c may include the same or similar components as that of the gate structure 200b, which is illustrated in FIG. 2B, and for the sake of simplicity, those components will not be discussed in detail again. In comparison with the embodiment of FIG. 2B where the protection layer 206 is disposed between the refractory metal layer 204 and the second metal layer 208, in the following embodiments, the protection layer is omitted.

As shown in FIG. 2C, the stack of the gate structure 200c may include a first metal layer 202, a refractory metal layer 204 disposed on the first metal layer 202, a third metal layer 210 disposed on the refractory metal layer 204, and a second metal layer 208 on the third metal layer 210, in accordance with some embodiments.

The stack arrangement of the gate structures 200a, 200b and 200c according to the present disclosure can reduce the stress on the underlying layer (such as the barrier layer 108 as shown in FIG. 1). Therefore, the intensive piezoelectric change can be alleviated, thereby decreasing instability. In describing one or more of these embodiments, the present disclosure may offer several advantages over prior art devices. In the discussion of the advantages or benefits that follows it should be noted that these benefits and/or results may be present in some embodiments, but are not required.

Referring back to FIG. 1, the transistor device 100 may include a plurality of contacts 114 disposed on the semiconductor layers and on opposite sides of the gate structure 112, such as a source contact and a drain contact, in accordance with some embodiments. The materials of the contacts 114 may include metal, such as tungsten (W), titanium (Ti), aluminum (Al), cobalt (Co), nickel (Ni), platinum (Pt), gold (Au), the like, an alloy thereof, or a combination thereof. The contact 104 may be a multi-layer structure. The contacts 114 may be formed by a deposition process, including chemical vapor deposition (CVD), physical vapor deposition (PVD), plating, the like, or a combination thereof.

As illustrated in FIG. 1, the transistor device 100 may include a passivation layer 116 disposed on the semiconductor layers, the contacts 114 and the gate structure 112, in accordance with some embodiments. The passivation layer 116 may extend between sidewalls of the cap layer 110. The material of the passivation layer 116 may include dielectric materials, such as silicon oxide, silicon nitride, silicon oxynitride, polymer, the like, or a combination thereof, but not limited thereto. The passivation layer 116 may be deposited by a CVD process, an atomic layer deposition (ALD) process, a plasma-enhanced chemical vapor deposition (PECVD) process, the like, or a combination thereof.

As further illustrated in FIG. 1, the transistor device 100 may include a dielectric layer 118 disposed on the passivation layer 116, in accordance with some embodiments. The material of the dielectric layer 118 may include organic or inorganic insulating materials, such as silicon oxide, silicon nitride, silicon oxynitride, polymer, the like, or a combination thereof. The dielectric layer 118 may be formed by a deposition process, including CVD, PECVD, the like, or a combination thereof.

FIGS. 3A-3D are cross-sectional views of a transistor device at various stages of manufacture in accordance with some embodiments. Additional features and steps can be added, and some of the features and steps described below can be replaced or eliminated for different embodiments. To simplify the diagram, only a portion of the transistor device is illustrated.

As shown in FIG. 3A, a first patterned photoresist 302 is formed on the cap layer 110, in accordance with some embodiments. The first patterned photoresist 302 may include a positive photoresist or a negative photoresist. The first patterned photoresist 302 may be formed by a deposition process, a photolithography process, other suitable processes, or a combination thereof. For example, the deposition process may include spin-on coating, CVD, ALD, the like, or a combination thereof. The photolithography process may include photoresist coating (e.g., spin coating), soft baking, mask aligning, exposure, post-exposure baking (PEB), developing, rinsing, drying (e.g., hard baking), other suitable processes, or a combination thereof.

In some embodiments, an opening 304 is formed in the first patterned photoresist 302 to expose a portion of the semiconductor layer (e.g., the cap layer 110).

As shown in FIG. 3B, a second patterned photoresist 306 is formed on the first patterned photoresist 302, in accordance with some embodiments. The second patterned photoresist 306 may be similar to the first patterned photoresist 302, and will not be repeated. In some embodiments, an opening 308 is formed in the second patterned photoresist 306 to expose portion(s) of the semiconductor layer (e.g., the cap layer 110) and the first patterned photoresist 302. The opening 308 of the second patterned photoresist 306 may overlap the opening 304 of the first patterned photoresist 302 when viewed in the direction substantially vertical to the top surface of the barrier layer 108.

As shown in FIG. 3C, a recess 310 may be formed in the cap layer 110 and/or the barrier layer 108, and a portion of the barrier layer 108 may be exposed, in accordance with some embodiments. In other embodiment, the recess 310 may not extend through the cap layer 110, and thus the barrier 108 is not exposed. The recess 310 may be formed by etching the cap layer 110 through the first patterned photoresist 302 and the second patterned photoresist 306 using an etching process, including a dry etching process, a wet etching process, or a combination thereof. For example, the dry etching process may include reactive ion etch (RIE), inductively-coupled plasma (ICP) etching, neutral beam etch (NBE), electron cyclotron resonance (ERC) etching, the like, or a combination thereof. The wet etching process may use, for example, hydrofluoric acid (HF), ammonium hydroxide ($NH_4OH$), or any suitable etchant. The sidewalls of the cap layer 110 may be inclined or curved. For example, the distance D1 between the top portions of the cap layer 110 may be less than the distance D2 between the bottom portions of the cap layer 110. The distance D1 may refer to the minimum distance between the top portions of the cap layer 110. The distance D2 may refer to the minimum distance between the bottom portions of the cap layer 110.

Next, a gate structure 112 may be formed in the opening 304, the opening 308, and/or the recess 310, in accordance with some embodiments. Exemplary embodiments of forming the gate structure 112 will be described below with reference to FIGS. 4A-4F, 6A-6D and 8A-8D.

As illustrated in FIG. 3D, the first patterned photoresist 302 and the second patterned photoresist 306 may be removed by an ashing process, a dissolving process, or any suitable process. Then, a passivation layer and a dielectric layer (not illustrated) may be formed on the barrier layer 108, the cap layer 110, and the gate structure 112, and may fill the recess 310 in subsequent processes.

FIGS. 4A-4F are cross-sectional views of a transistor device 400 at various stages of manufacture in accordance with some embodiments. Additional features and steps can be added, and some of the features and steps described below can be replaced or eliminated for different embodiments. To simplify the diagram, only a portion of the transistor device 400 is illustrated. Exemplary embodiments of the materials of a gate structure for the transistor device 400 have been discussed above with reference to FIGS. 2A-2C, and the materials described below are non-limiting examples.

Figures 4A, 4B:
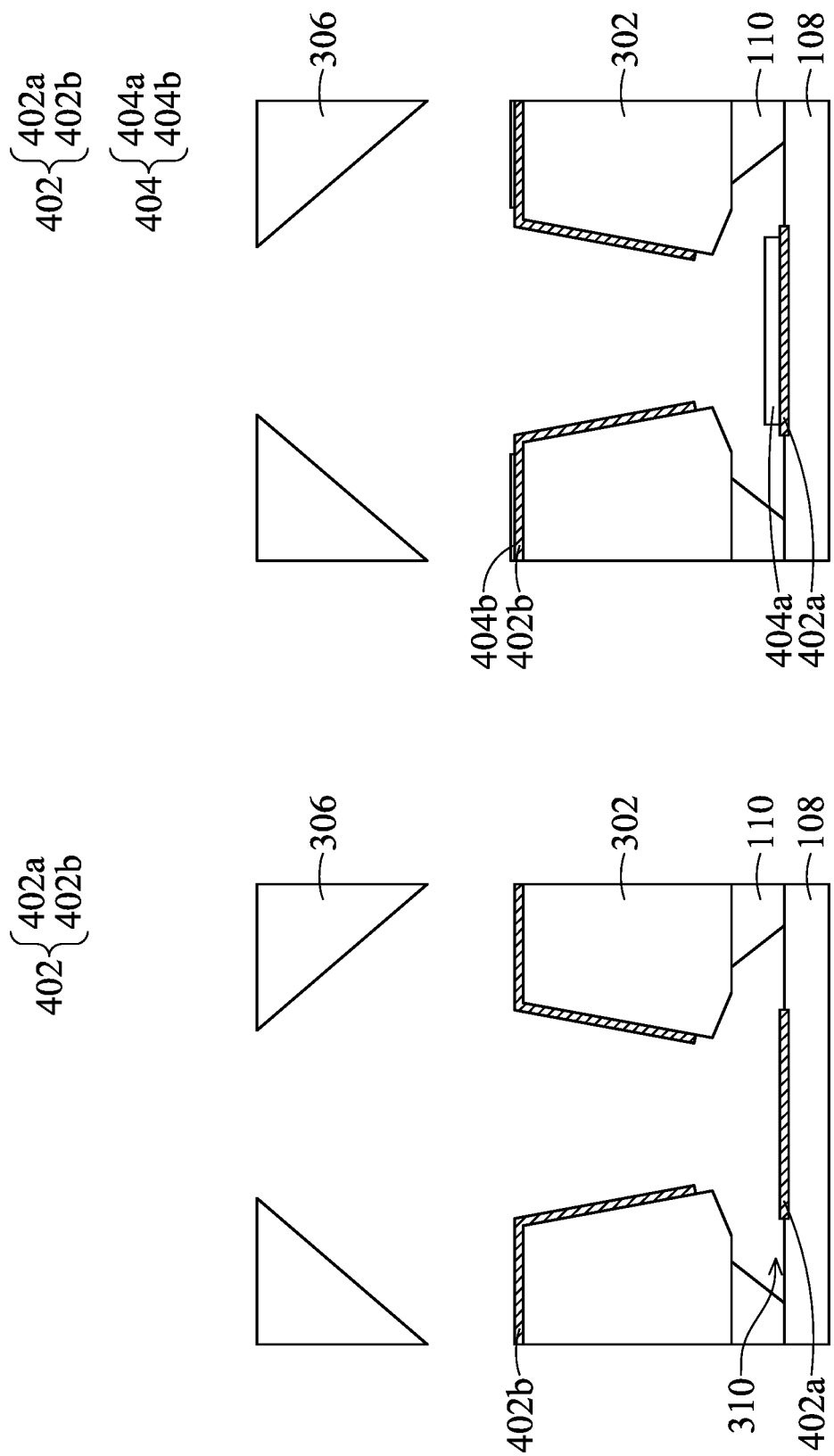

As shown in FIG. 4A, a first metal layer 402 is formed on the barrier layer 108 and/or the first patterned photoresist 302, in accordance with some embodiments. The first metal layer 402 may be a Pt layer. The first metal layer 402 may have a lower portion 402a in the recess 310 and upper portions 402b on the first patterned photoresist 302. The upper portions 402b of the first metal layer 402 may cover a top surface and/or sidewalls of the first patterned photoresist 302. In some embodiments, the lower portion 402a and the upper portions 402b of the first metal layer 402 are separate (or disconnected) due to the shape of the first patterned photoresist 302 and/or the thickness of the first metal layer 402.

As shown in FIG. 4B, a refractory metal layer 404 may be formed on the first metal layer 402, in accordance with some embodiments. The refractory metal layer 404 may be a Mo layer. The refractory metal layer 404 may have a lower portion 404a on the lower portion 402a of the first metal layer 402 and upper portions 404b on the upper portions 402b of the first metal layer 402, respectively. The upper portions 404b of the refractory metal layer 404 may cover the first metal layer 402 on the top surface of the first patterned photoresist 302, and a portion of the first metal layer 402 disposed on the sidewalls of the first patterned photoresist 302 may be exposed. In some embodiments, the lower portion 404a and the upper portions 404b of the refractory metal layer 404 are separate (or disconnected).

As shown in FIG. 4C, a protection layer 406 is formed on the refractory metal layer 404, in accordance with some embodiments. The protection layer 406 may be a Ni layer. The protection layer 406 may have a lower portion 406a on the lower portion 404a of the refractory metal layer 404 and upper portions 406b on the upper portions 402b of the first metal layer 402 and the upper portions 404b of the refractory metal layer 404. The upper portions 406b of the protection layer 406 may extend from the top surface of the refractory metal layer 404 to the top surface of the first metal layer 402 and may cover the sidewalls of the upper portions 404b of the refractory metal layer 404. In some embodiments, the lower portion 406a and the upper portions 406b of the protection layer 406 are separate (or disconnected). In some embodiments, the thickness of the upper portion may be less than that of the bottom portion, for example, the thickness of the upper portion 404b is less than that of the bottom portion 404a, but not limited thereto. The thickness may refer to the maximum thickness measured in the normal direction of the barrier layer 108.

As shown in FIG. 4D, a third metal layer 408 is formed on the protection layer 406, in accordance with some embodiments. The third metal layer 408 may be a Pt layer. The third metal layer 408 may extend from the upper portions 406b to the lower portion 406a of the protection layer 406.

Figure 4E:
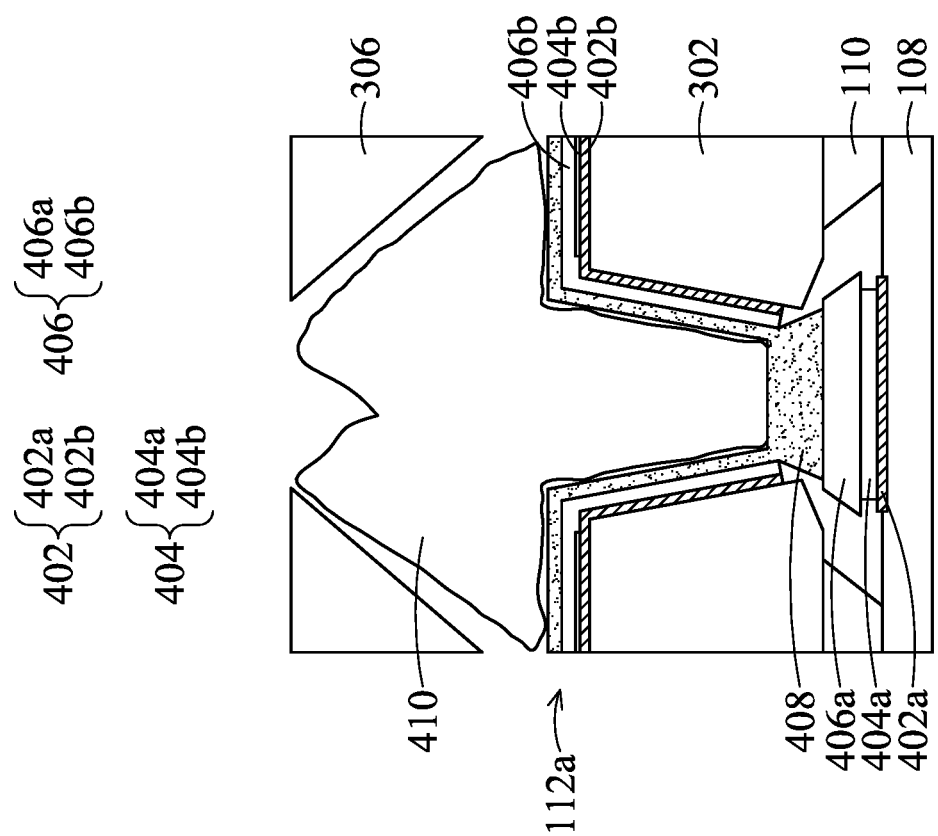

As shown in FIG. 4E, a second metal layer 410 is formed on the third metal layer 408, in accordance with some embodiments. The second metal layer 410 may be an Au layer. The second metal layer 410 may at least partially fill the remaining space of the opening 308. In some embodiments, a gate structure 112a may include the first metal layer 402, the refractory metal layer 404, the protection layer 406, the third metal layer 408, and the second metal layer 410.

Figures 4F, 5:
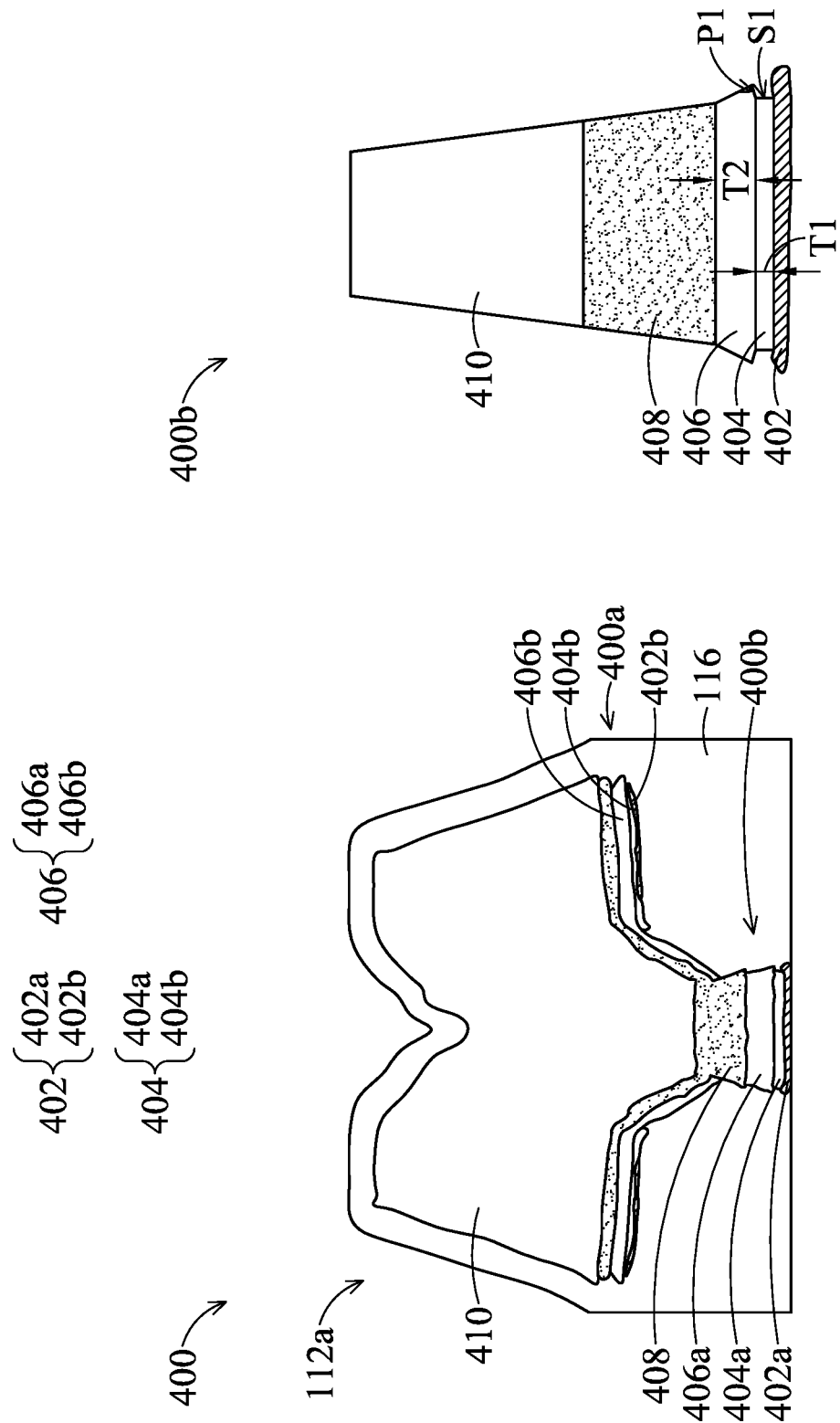

As shown in FIG. 4F, the first patterned photoresist 302 and the second patterned photoresist 306 are removed, in accordance with some embodiments. The portions of the first metal layer 402 which cover the sidewalls of the first patterned photoresist 302 may also be partially or wholly removed in the same process. In some embodiments, only the horizontal part of the upper portions 402b of the first metal layer 402 may remain, but not limited thereto.

Then, the passivation layer 116 may be formed to surround the gate structure 112a. In some embodiments, the first metal layer 402, the refractory metal layer 404, and the protection layer 406 may have disconnected portions, and the sidewalls of these layers may be not covered by the previously formed layers at the bottom portion 400b of the gate structure 112a. Therefore, the passivation layer 116 may be in contact with the first metal layer 402, the refractory metal layer 404, the protection layer 406, and the third metal layer 408 at the bottom portion 400b of the gate structure 112a. In particular, the lower portion 402a and the upper portions 402b of the first metal layer 402, the lower portion 404a and the upper portions 404b of the refractory metal layer 404, and the lower portion 406a and the upper portions 406b of the protection layer 406 may be spaced apart by the passivation layer 116.

As shown in FIG. 4F, at the side portion 400a of the gate structure 112a, the first metal layer 402, the refractory metal layer 404, the protection layer 406, and the third metal layer 408 may have curved profiles. A curve profile may refer to at least a part of a surface is curved, but not limited thereto. At the side portion 400a of the gate structure 112a, the refractory metal layer 404 may cover the sidewalls of the first metal layer 402, and the protection layer 406 may cover the sidewalls of the refractory metal layer 404.

The lengths of the first metal layer 402, the refractory metal layer 404, the protection layer 406, and the third metal layer 408 may be different from each other. For example, at the side portion 400a of the gate structure 112a, the length of the protection layer 406 or the third metal layer 408 may be greater than that of the refractory metal layer 404, and the length of the protection layer 406 or the third metal layer 408 may be greater than that of the first metal layer 402.

FIG. 5 is an enlarged view of the bottom portion 400b of the gate structure 112a of FIG. 4F, in accordance with some embodiments of the present disclosure. The length of the first metal layer 402 may be greater than that of the refractory metal layer 404, and the length of the first metal layer 402 may be greater than the protection layer 406. The length of the protection layer 406 may be greater than that of the refractory metal layer 404, and thus a pit P1 may be formed adjacent to the interface between the refractory metal layer 404 and the protection layer 406. The sidewall S1 of the refractory metal layer 404 may be substantially vertical to the top surface of the first metal layer 402, but not limited thereto.

The refractory metal layer 404 may have a thickness T1 in a range between about 100 Å and about 200 Å, such as about 125 Å, about 150 Å, or about 175 Å. The protection layer 406 may have a thickness T2 in a range between about 200 Å and about 400 Å, such as about 250 Å, about 300 Å, or about 350 Å. The thickness T1 of the refractory metal layer 404 may be less than the thickness T2 of the protection layer 406. In some embodiments, the ratio of the thickness T1 of the refractory metal layer 404 to the thickness T2 of the protection layer 406 is in range between about 0.25 and about 0.5, such as about 0.3, about 0.35, or about 0.4. The range or ratio mentioned above may reduce the diffusion of the metal layers, and thus good electrical characteristics of the semiconductor device may be achieved.

FIGS. 6A-6D are cross-sectional views of a transistor device 600 at various stages of manufacture in accordance with some embodiments. Additional features and steps can be added, and some of the features and steps described below can be replaced or eliminated for different embodiments. To simplify the diagram, only a portion of the transistor device 600 is illustrated. Exemplary embodiments of the materials of a gate structure for the transistor device 600 have been discussed above with reference to FIGS. 2A-2C, and the materials described below are non-limiting examples.

FIG. 6A may be a process step following FIG. 4B. As shown in FIG. 6A, a protection layer 602 is formed on the refractory metal layer 404, in accordance with some embodiments. The protection layer 602 may be a Ti layer. The protection layer 602 may have a lower portion 602a on the lower portion 404a of the refractory metal layer 404 and upper portions 602b on the upper portions 402b of the first metal layer 402 and the upper portions 404b of the refractory metal layer 404. The upper portions 602b of the protection layer 602 may extend from the top surface of the refractory metal layer 404 to the top surface of the first metal layer 402 and on the sidewalls of the upper portions 404b of the refractory metal layer 404. In some embodiments, the lower portion 602a and the upper portions 602b of the protection layer 602 are separate (or disconnected).

As shown in FIG. 6B, a third metal layer 408 is formed on the protection layer 602, in accordance with some embodiments. The third metal layer 408 may be a Pt layer. The third metal layer 408 may extend from the upper portions 602b to the lower portion 602a of the protection layer 602.

Figure 6C:
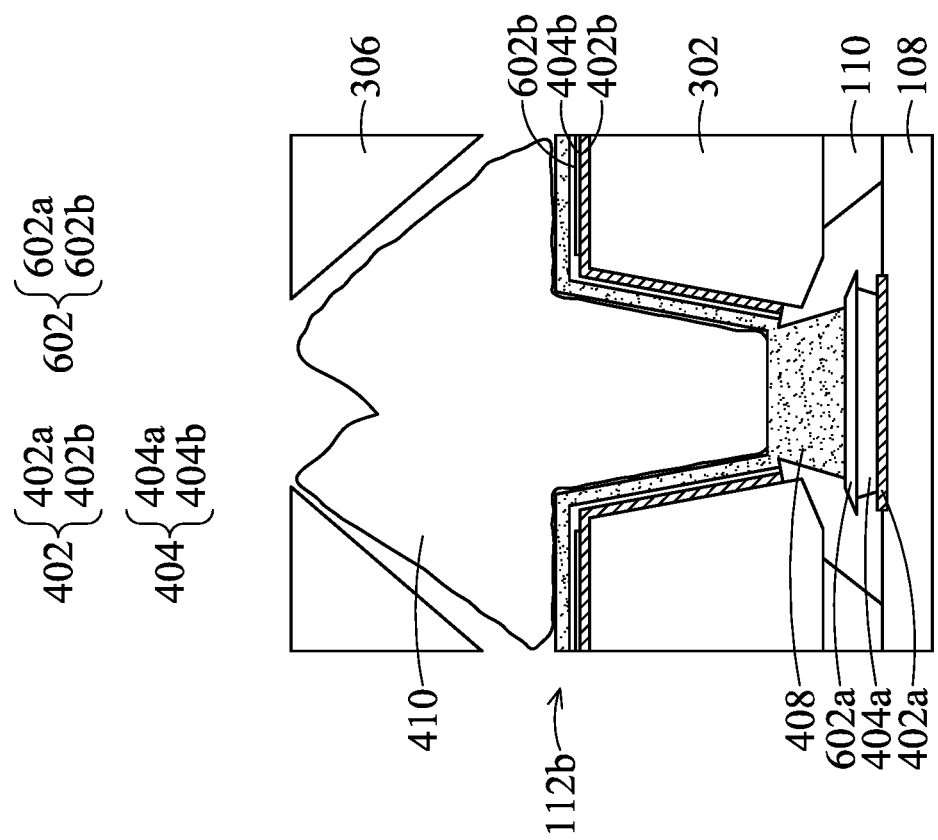

As shown in FIG. 6C, a second metal layer 410 is formed on the third metal layer 408, in accordance with some embodiments. The second metal layer 410 may be an Au layer. The second metal layer 410 may at least partially fill the remaining space of the opening 308. In some embodiments, a gate structure 112b may include the first metal layer 402, the refractory metal layer 404, the protection layer 602, the third metal layer 408, and the second metal layer 410.

As shown in FIG. 6D, the first patterned photoresist 302 and the second patterned photoresist 306 are removed, in accordance with some embodiments. The portions of the first metal layer 402 which cover the sidewalls of the first patterned photoresist 302 may also be partially or wholly removed in the same process. As a result, only the horizontal part of the upper portions 402b of the first metal layer 402 may remain. The upper portions 602b of the protection layer 602 may also be divided into horizontal parts and inclined parts which are separate (or disconnected). The horizontal parts may refer to the parts formed on the top surface of the aforementioned first patterned photoresist 302, while the inclined parts may refer to the parts formed on the sidewall of the aforementioned first patterned photoresist 302, but not limited thereto.

Then, the passivation layer 116 may be formed to surround the gate structure 112b. In some embodiments, the first metal layer 402, the refractory metal layer 404, and the protection layer 602 may have disconnected portions, and the sidewalls of these layers may be not covered by the previously formed layers at the bottom portion 600b of the gate structure 112b. Therefore, the passivation layer 116 may be in contact with the first metal layer 402, the refractory metal layer 404, the protection layer 602, and the third metal layer 408 at the bottom portion 600b of the gate structure 112b. In particular, the lower portion 402a and the upper portions 402b of the first metal layer 402, the lower portion 404a and the upper portions 404b of the refractory metal layer 404, and the lower portion 602a and the upper portions 602b of the protection layer 602 may be spaced apart by the passivation layer 116. The passivation layer 116 may also extend between the horizontal part and the inclined part of the protection layer 602.

As shown in FIG. 6D, at the side portion 600a of the gate structure 112b, the first metal layer 402, the refractory metal layer 404, the protection layer 602, and the third metal layer 408 may have curved profiles. At the side portion 600a of the gate structure 112b, the refractory metal layer 404 may cover the sidewalls of the first metal layer 402, the protection layer 602 may cover the sidewalls of the refractory metal layer 404, and the third metal layer 408 may cover the sidewalls of the horizontal parts of the protection layer 602.

The lengths of the first metal layer 402, the refractory metal layer 404, the protection layer 602 and the third metal layer 408 may be different from each other. For example, at the side portion 600a of the gate structure 112b, the length of the protection layer 602 or the third metal layer 408 may be greater than that of the refractory metal layer 404, and the length of the protection layer 602 or the third metal layer 408 may be greater than that of the first metal layer 402.

FIG. 7 is an enlarged view of the bottom portion 600b of the gate structure 112b of FIG. 6D, in accordance with some embodiments of the present disclosure. The length of the first metal layer 402 may be greater than that of the refractory metal layer 404, the length of the first metal layer 402 may be greater than that of the protection layer 602, and the length of the protection layer 602 may be greater than that of the refractory metal layer 404.

The sidewall S2 of the refractory metal layer 404 may be tapered. In particular, the profile of the refractory metal layer 404 may be inverted trapezoid. The protection layer 602 may extend to cover (or surround) the sidewall S2 of the refractory metal layer 404, and thus an oxide film 702 may be formed between the protection layer 602 and the refractory metal layer 404. In some embodiments, the material of the oxide film 702 includes titanium oxide ($TiO_x$).

The refractory metal layer 404 may have a thickness T3 in a range between about 100 Å and about 200 Å, such as about 125 Å, about 150 Å, or about 175 Å. The protection layer 602 may have a thickness T4 in a range between about 50 Å and about 100 Å, such as about 60 Å, about 75 Å, or about 90 Å. By reducing the thickness T4 of the protection layer 602, the piezoelectric effect can be reduced. The thickness T3 of the refractory metal layer 404 may be greater than the thickness T4 of the protection layer 602. In some embodiments, the ratio of the thickness T3 of the refractory metal layer 404 to the thickness T4 of the protection layer 602 is in range between about 1 and about 3, such as about 1.3 or about 2. The range or ratio mentioned above may reduce the diffusion of the metal layers, and thus good electrical characteristics of the semiconductor device may be achieved.

FIGS. 8A-8D are cross-sectional views of a transistor device 800 at various stages of manufacture in accordance with some embodiments. Additional features and steps can be added, and some of the features and steps described below can be replaced or eliminated for different embodiments. To simplify the diagram, only a portion of the transistor device 800 is illustrated. Exemplary embodiments of the materials of a gate structure for the transistor device 800 have been discussed above with reference to FIGS. 2A-2C, and the materials described below are non-limiting examples.

FIG. 8A may be a process step following FIG. 4B. As shown in FIG. 8A, a refractory metal layer 802 is formed on the first metal layer 402, in accordance with some embodiments. The refractory metal layer 802 may have a lower portion 802a on the lower portion 402a of the first metal layer 402 and upper portions 802b on the upper portions 402b of the first metal layer 402, respectively. The upper portions 802b of the refractory metal layer 802 may extend on the top surface and the sidewalls of the first patterned photoresist 302. Particularly, the upper portions 802b of the refractory metal layer 802 may cover the entire top surface of the first metal layer 402. In some embodiments, the lower portion 802a and the upper portions 802b of the refractory metal layer 802 are separate (or disconnected).

As shown in FIG. 8B, a third metal layer 408 is formed on the refractory metal layer 802, in accordance with some embodiments. The third metal layer 408 may extend from the upper portions 802b to the lower portion 802a of the refractory metal layer 802. In some embodiments, the third metal layer 408 covers the sidewalls of the upper portions 402b of the first metal layer 402.

Figure 8C:
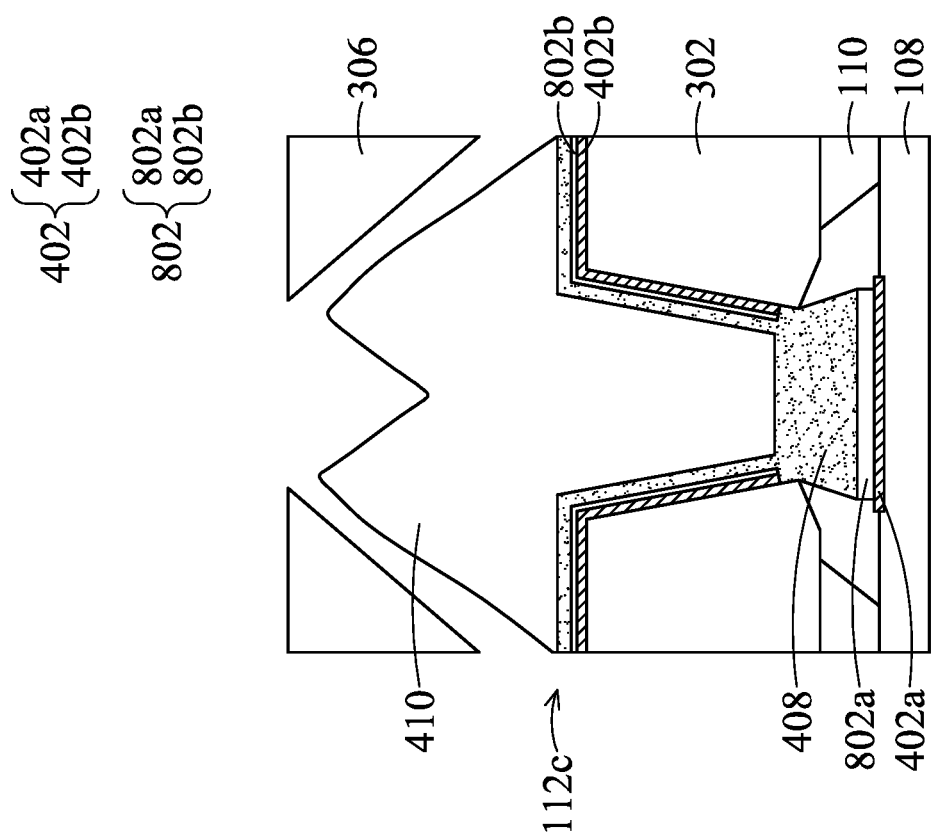

As shown in FIG. 8C, a second metal layer 410 is formed on the third metal layer 408, in accordance with some embodiments. The second metal layer 410 may at least partially fill the remaining space of the opening 308. In some embodiments, a gate structure 112c may include the first metal layer 402, the refractory metal layer 802, the third metal layer 408, and the second metal layer 410.

Figure 8D:
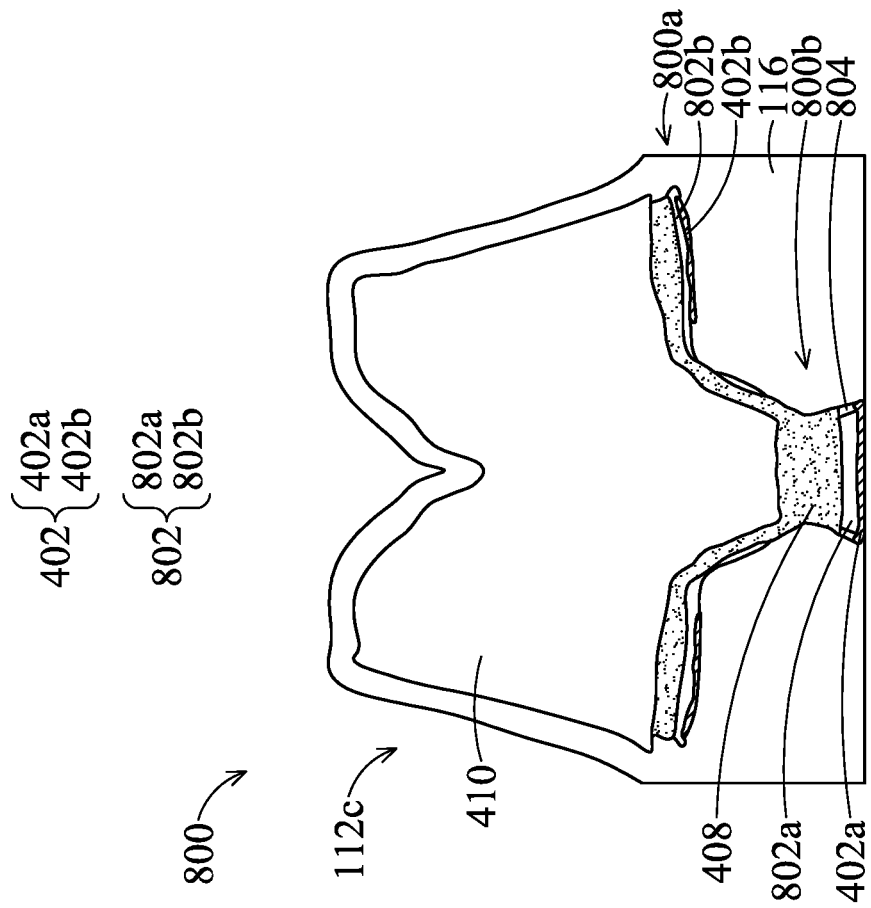

As shown in FIG. 8D, the first patterned photoresist 302 and the second patterned photoresist 306 are removed, in accordance with some embodiments. The portions of the first metal layer 402 which cover the sidewalls of the first patterned photoresist 302 may also be partially or wholly removed in the same process. In some embodiments, only the horizontal part of the upper portions 402b of the first metal layer 402 may remain, but not limited thereto. The upper portions 802b of the refractory metal layer 802 may also be divided into horizontal parts and inclined parts which are separate (or disconnected).

As illustrated in FIG. 8D, the gate structure 112c may further include an oxide film 804 covering the sidewalls of the refractory metal layer 802, in accordance with some embodiments. The oxide film 804 may be formed between the first metal layer 402 and the third metal layer 408. The oxide film 804 may be a filamentous oxide or may have a filamentous portion at the surface, but not limited thereto. Although the oxide film 804 is formed at the bottom portion 800b of the gate structure 112c, as shown in FIG. 8D, the oxide film 804 may also formed at the side portion 800a of the gate structure 112c, but not limited thereto.

Then, the passivation layer 116 may be formed to cover the gate structure 112c. In some embodiments, since the first metal layer 402 and the refractory metal layer 802 have disconnected portions, the sidewalls of these layers may be not covered by the previously formed layers at the bottom portion 800b of the gate structure 112c. Therefore, the passivation layer 116 may be in contact with the first metal layer 402, the oxide film 804, and the third metal layer 408 at the bottom portion 800b of the gate structure 112c. In particular, the lower portion 402a and the upper portions 402b of the first metal layer 402 and the lower portion 802a and the upper portions 802b of the refractory metal layer 802 may be spaced apart by the passivation layer 116. The passivation layer 116 may also extend between the horizontal part and the inclined part of the refractory metal layer 802.

As shown in FIG. 8D, at the side portion 800a of the gate structure 112c, the first metal layer 402, the refractory metal layer 802, and the third metal layer 408 may have curved profiles. At the side portion 800a of the gate structure 112c, the refractory metal layer 802 may cover the sidewalls of the first metal layer 402, and the third metal layer 408 may cover the sidewalls of the horizontal parts of the refractory metal layer 802.

The lengths of the first metal layer 402, the refractory metal layer 802, and the third metal layer 408 may be different from each other. For example, at the side portion 800a of the gate structure 112c, the length of the third metal layer 408 may be greater than that of the refractory metal layer 802, and the length of the third metal layer 408 may be greater than that of the first metal layer 402.

Figure 9:
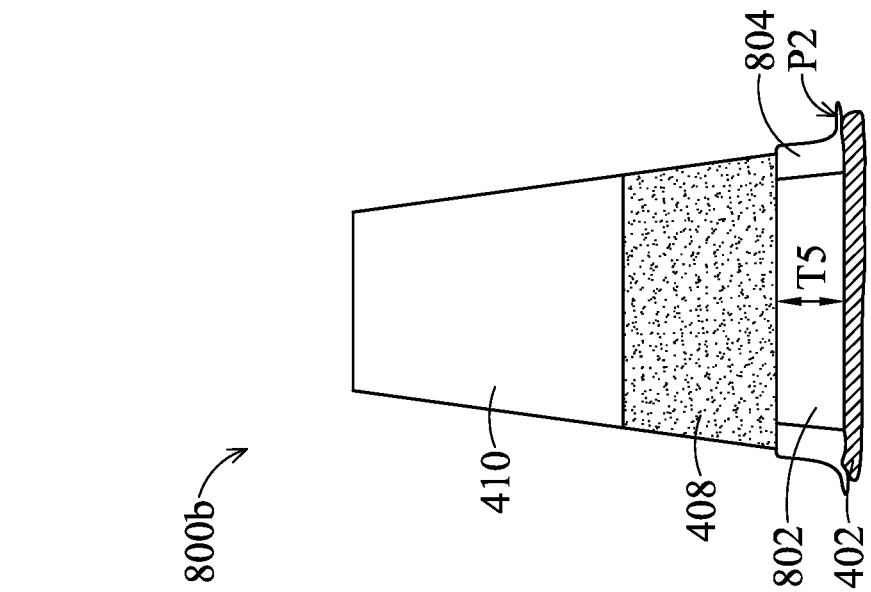
FIG. 9 is a cross-sectional view of a portion of the exemplary transistor device of FIG. 8D in accordance with some embodiments.

FIG. 9 is an enlarged view of the bottom portion 800b of the gate structure 112c of FIG. 8D, in accordance with some embodiments of the present disclosure. The length of the first metal layer 402 may be greater than that of the refractory metal layer 802. Since the oxide film 804 may be formed on the sidewalls of the refractory metal layer 802 and may extend beyond the sidewalls of the third metal layer 408, there may be a pit adjacent to the interface between the refractory metal layer 802 and third metal layer 408.

In some embodiments, the oxide film 804 may have a tail portion P2 extending on the top surface of the first metal layer 402. The tail portion P2 may extend beyond the sidewalls of the first metal layer 402 and the third metal layer 408. The refractory metal layer 802 may have a thickness T5 in a range between about 100 Å and about 300 Å, such as about 150 Å, about 200 Å, or about 250 Å.

In one aspect, the gate structure may be disposed on the substrate and may include a first metal layer and a refractory metal layer disposed on the first metal layer, wherein the first metal layer is disconnected and the refractory metal layer is disconnected.

In another aspect, a stack arrangement of the gate structure may include a first metal layer, a refractory metal layer disposed on the first metal layer, a protection layer disposed on the refractory metal layer, and a second metal layer disposed on the protection layer.

While the present disclosure has been described by way of example and in terms of the preferred embodiments, it should be understood that the present disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A transistor device, comprising:
    a gate structure disposed on a substrate and comprising:
    a first metal layer; and
    a refractory metal layer disposed on the first metal layer, comprising a lower portion and an upper portion which are separate, wherein a part of a surface of the upper portion of the refractory metal layer is curved,
    wherein the first metal layer has two separate portions.

2. The transistor device as claimed in claim 1, wherein a material of the refractory metal layer comprises molybdenum, tantalum, tungsten, niobium, rhenium, an alloy thereof, or a combination thereof.

3. The transistor device as claimed in claim 1, wherein the gate structure further comprises a protection layer disposed on the refractory metal layer.

4. The transistor device as claimed in claim 3, wherein a material of the protection layer comprises nickel, titanium, aluminum, tantalum, chromium, zirconium, yttrium, niobium, lanthanum, hafnium, tungsten, an alloy thereof, or a combination thereof.

5. The transistor device as claimed in claim 1, wherein the gate structure further comprises a second metal layer disposed on the refractory metal layer.

6. The transistor device as claimed in claim 5, wherein a material of the second metal layer comprises gold.

7. The transistor device as claimed in claim 5, wherein the gate structure further comprises a third metal layer disposed between the protection layer and the second metal layer.

8. The transistor device as claimed in claim 7, wherein a material of the third metal layer comprises platinum.

9. The transistor device as claimed in claim 1, the gate structure further comprises an oxide film disposed on the first metal layer and disposed on at least one of sidewalls of the refractory metal layer.

10. The transistor device as claimed in claim 9, wherein the oxide film has a tail portion extending beyond a sidewall of the first metal layer.

11. A transistor device, comprising:
    a gate structure disposed on a plurality of semiconductor layers and comprising:
    a first metal layer;
    at least one refractory metal layer disposed on the first metal layer comprising a lower portion and an upper portion which are separate, wherein a part of a surface of the upper portion of the refractory metal layer is curved; and
    a second metal layer disposed on the refractory metal layer; and
    a passivation layer surrounding the gate structure and in contact with the first metal layer and the refractory metal layer at a bottom portion of the gate structure.

12. The transistor device as claimed in claim 11, wherein the transistor device is a HEMT or a pHEMT.

13. The transistor device as claimed in claim 11, wherein the at least one refractory metal layer comprises a molybdenum layer and a nickel layer disposed on the molybdenum layer.

14. The transistor device as claimed in claim 11, wherein the at least one refractory metal layer comprises a molybdenum layer and a titanium layer disposed on the molybdenum layer.

15. The transistor device as claimed in claim 14, wherein the titanium layer is disposed on a sidewall of the molybdenum layer, and the gate structure further comprises a titanium oxide film between the titanium layer and the sidewall of the molybdenum layer.

16. The transistor device as claimed in claim 11, wherein the refractory metal layer comprises a tantalum layer and the gate structure further comprises an oxide film disposed on at least one of sidewalls of the tantalum layer.

17. A gate structure, comprising:
    a sinking layer comprising a first lower portion and a first upper portion which are separate;
    a refractory metal layer comprising a second lower portion and a second upper portion which are separate, wherein the second lower portion is disposed on the first lower portion and the second upper portion is disposed on the first upper portion, wherein a part of a surface of the upper portion of the refractory metal layer is curved; and
    a contact layer disposed on the refractory metal layer.

18. The gate structure as claimed in claim 17, wherein the second upper portion of the refractory metal layer is disposed on a sidewall of the first upper portion of the sinking layer.

19. The gate structure as claimed in claim 17, wherein a length of the first lower portion of the sinking layer is greater than a length of the second lower portion of the refractory metal layer.

* * * * *